United States Patent
Canella et al.

[11] Patent Number: 5,997,388
[45] Date of Patent: *Dec. 7, 1999

[54] APPARATUS FOR REMOVING MARKS FROM INTEGRATED CIRCUIT DEVICES

[75] Inventors: Robert L. Canella, Meridian; Tony T. Ibarra, Nampa, both of Id.

[73] Assignee: Micron Electronics, Inc., Nampa, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/909,187

[22] Filed: Aug. 11, 1997

[51] Int. Cl.$^6$ ....................................... B24B 7/06
[52] U.S. Cl. ........................ 451/67; 451/300; 451/336; 451/337; 451/339; 451/449
[58] Field of Search ................... 451/5, 6, 8, 41, 451/53, 54, 67, 331, 336, 337, 339, 444, 449, 299, 300

[56] References Cited

U.S. PATENT DOCUMENTS

| | | |
|---|---|---|
| 3,603,041 | 9/1971 | McDonald . |
| 4,375,025 | 2/1983 | Carlson . |
| 4,513,539 | 4/1985 | Steinback . |
| 4,587,771 | 5/1986 | Buchner et al. ........................ 451/28 |
| 4,638,144 | 1/1987 | Latta, Jr. . |
| 4,674,238 | 6/1987 | Suzuki et al. ............................. 451/81 |
| 4,707,722 | 11/1987 | Folk et al. . |
| 4,945,204 | 7/1990 | Nakamura et al. . |
| 4,993,588 | 2/1991 | Willberg et al. . |
| 5,220,754 | 6/1993 | Tayebi et al. . |
| 5,335,458 | 8/1994 | Stoffers et al. . |
| 5,348,033 | 9/1994 | Levit . |
| 5,357,077 | 10/1994 | Tsuruta . |
| 5,551,959 | 9/1996 | Martin et al. . |
| 5,618,227 | 4/1997 | Tsutsumi et al. ...................... 451/66 X |
| 5,643,044 | 7/1997 | Lund .................................... 451/41 X |
| 5,679,055 | 10/1997 | Greene et al. ........................ 451/41 X |
| 5,679,059 | 10/1997 | Nishi et al. ............................... 451/41 |
| 5,679,060 | 10/1997 | Leonard et al. ...................... 451/41 X |

*Primary Examiner*—Timonthy V. Eley
*Attorney, Agent, or Firm*—Trask, Britt & Rossa

[57] ABSTRACT

A de-marking apparatus and method are provided for de-marking a marked packaged integrated circuit (IC). The de-marking apparatus comprises a de-marking head for removing a thin layer of material from the marked surface. The apparatus may also include mechanisms for feeding, transferring and conveying the marked ICs to and from the de-marking head, and washing, drying, and receiving the de-marked ICs in an automated fashion. The method includes physically removing package material from a marked IC surface and producing a surface reflectivity suitable for re-marking with a laser beam.

80 Claims, 9 Drawing Sheets

APPARATUS FOR REMOVING MARKS FROM INTEGRATED CIRCUIT DEVICES

This application is related to application Ser. No. 08/907962, filed Aug. 11, 1987, Attorney Docket No. 3054. US by the same inventors filed on even date herewith and entitled METHOD FOR REMOVING MARKS FROM INTEGRATED CIRCUIT DEVICES AND DEVICES SO PROCESSED.

BACKGROUND OF THE INVENTION

This invention relates generally to devices and methods for de-marking packaged integrated circuits (ICs) and, more specifically, to systems and processes for removing a thin layer of filled polymeric or ceramic packaging material from surfaces of IC packages to produce a de-marked, highly reflective surface suitable for re-marking.

Since the first packaged integrated circuits (ICs) became commercially available, manufacturers have often found it necessary to identify packaged ICs by marking each IC or packaged assembly of ICs with the manufacturer's name, a part or serial number, or other identifying information such as a lot number or a wafer and/or die location. As the majority of ICs are packaged in a transfer-molded, filled polymer compound, most current marking systems have been developed for this type of packaging.

Manufacturers initially marked packaged ICs using mechanical ink transferring devices, such as stamps or rollers, with or without stencils, to transfer ink to the surface of an IC. Because of the mechanical nature of the process and the drying time associated with ink, ink stamping systems are relatively slow and the applied ink susceptible to smudging. Also, the quality of ink-stamped marks on packaged ICs can vary substantially over time and from IC to IC due to variations in the quality and quantity of ink applied, ambient temperature and humidity, and the condition and finish of the surface of the stamp and package.

Because of the deficiencies associated with ink stamping, manufacturers have in recent years switched to using a laser beam to mark the surface of a packaged IC. Unlike ink stamping, laser marking is very fast, requires no curing time, produces a consistently high quality mark, and can take place at any point in the manufacturing process.

Various machines and methods have been developed for marking ICs with a laser. As illustrated in U.S. Pat. Nos. 5,357,077 to Tsuruta, 4,945,204 to Nakamura et al., 4,638,144 to Latta, Jr., and 4,375,025 to Carlson, a semiconductor device is placed in a position where a laser beam, such as that produced by a carbon dioxide or neodymium-yttrium-aluminum garnet laser, inscribes various characters or other information on a surface of the semiconductor device. The laser beam burns away a small amount of the surface of the semiconductor device so that the area where the characters are to appear has a different reflectivity from the rest of the surface of the device. By holding the semiconductor device at a proper angle to a light source, the characters inscribed on the device by the laser can be read.

U.S. patent application Ser. No. 08/590,919 filed Jan. 24, 1996, by one of the present inventors, assigned to the assignee of the present invention and hereby incorporated herein by reference, discloses yet another laser marking system which is operable at high throughput volumes and makes substantially constant use of a marking laser by use of a multi-track IC feed, marking and inspection procedure.

Because a laser mark is actually formed (burned) into the surface of the packaging material of a packaged device, a laser mark is a more permanent means of marking than ink stamping. If necessary, ink marks may be removed by heat or abrasion or, more typically, by employing solvents that will dissolve the ink and allow the ink to be removed from the surface of the IC without removing any measurable depth of packaging material from the surface of the IC. Conversely, when a recessed or "engraved" laser mark needs to be removed, a small layer of the surface of the package must be removed.

As described in U.S. Pat. No. 5,348,033 to Levit, it is often necessary to remove an existing mark on the package surface of an electronic component by employing some means of abrasion. For example, an existing mark on an IC must be removed when the IC is mismarked, when the quality of the mark on the IC does not meet acceptable parameters, or when, subsequent to marking, the IC is reclassified. After mark removal, the IC can be remarked with the desired information.

De-marking techniques currently known in the art include a Scotch-Brit™ belt surface finishing system and micro-abrasive blasting. Scotch-Brite™ surface finishing employs a mildly abrasive belt to buff and shine a surface of an IC for remarking after prior removal of an ink mark (typically by a solvent wash) but does not remove packaging material of the IC to any great extent, and is thus unsuitable for removing laser marks. The micro-abrasive blasting process is a grit blasting operation in which a grit-like material, such as a garnet powder or aluminum oxide particles, is directed onto the surface of an IC to remove ink markings, and this technique has also been attempted to remove laser marks.

Micro-abrasive blasting tends to remove a substantially uniform layer of material from the surface of an IC. Accordingly, cavities or depressions in the surface of an IC caused by an original laser marking operation are not easily removed by subsequent laser mark removal attempts using micro-abrasive blasting. As a result, to produce a flat surface for remarking, an unreasonable depth of packaging material must often be removed, compromising the integrity of the packaged IC. In addition, particulate abrasive de-marking processes dull the surface finish of an IC, and any attempt to re-mark the ICs with a laser may not produce a visibly distinct mark because of the reduced contrast between the surface finish of the de-marked IC and the new mark. Accordingly, such de-marked ICs may need to be coated with ink before being re-marked by a laser to make the new laser mark easily visible. The current cost of such coating for re-marking approaches or exceeds eight cents per IC, so potential savings by eliminating the ink coating before re-marking are enormous, at thousands of ICs per day throughput.

Thus, it would be advantageous to provide an apparatus and method for removing laser marks from the surfaces of packaged ICs that produce a somewhat reflective surface finish suitable for re-marking with a laser.

SUMMARY OF THE INVENTION

The present invention includes an apparatus and method for de-marking integrated circuits through controlled removal of package material from the marked surface, leaving a surface finish suitable for re-marking.

The apparatus of the present invention may include an IC retaining mechanism and a de-marking head positioned proximate the IC retaining mechanism so that the de-marking head may physically engage a surface of an IC held by the IC retaining mechanism.

The method of the present invention may include positioning an IC having a mark on an exterior surface thereof, and physically removing material from the marked IC surface to a depth sufficient to remove the mark.

DETAILED DESCRIPTION OF THE ILLUSTRATED EMBODIMENTS

Figure 1:
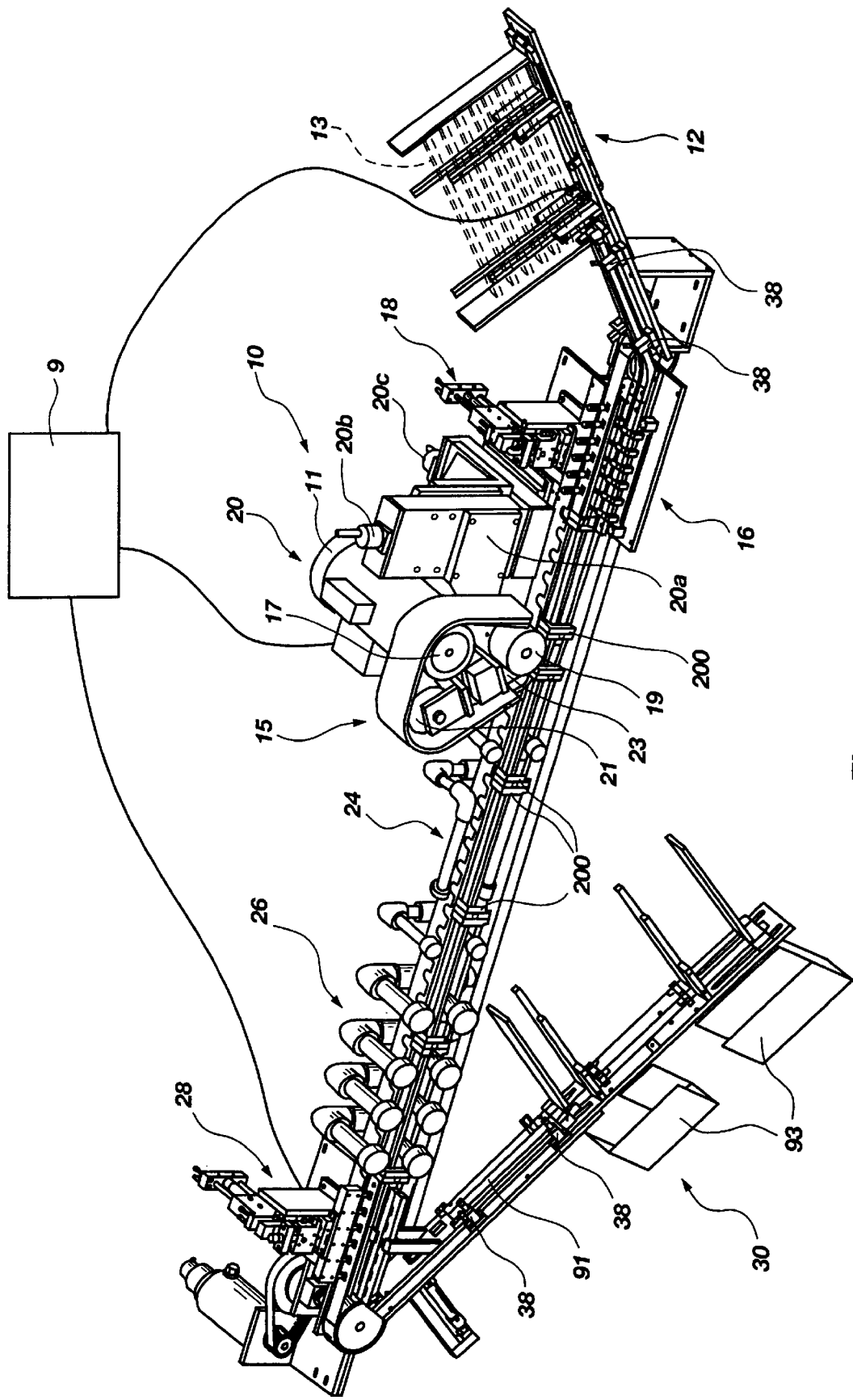
FIG. 1 is an isometric view of one embodiment of a system for removing laser marks from packaged semiconductor devices.

According to the present invention, a packaged integrated circuit de-marking apparatus and method are disclosed for removing a laser mark from a surface of a plastic (filled polymer) or ceramic packaged integrated circuit device (IC). In one embodiment, the apparatus can remove laser marks from at least 1000 and potentially in excess of 2000 plastic-packaged ICs per hour. As used herein, the term "laser mark" is used in its broadest sense, and includes marking by any conventional laser as well as other energy and particle-beam devices as known in the art, which devices may produce a recessed, indented or engraved mark on the surface of an IC. The de-marking apparatus provides a cutting or abrasive de-marking device, such as a blade, belt, wheel, or disc, having a cutting or abrasive surface which is precisely engageable with the marked surface of an IC. The de-marking device removes a substantially uniform, but extremely thin, layer from the packaging material, the depth of the layer being ideally only infinitesimally greater than the deepest depth of the mark removed. An even, approximately 0.001 inch layer is removed to provide a substantially planar surface on the IC for re-marking without compromising package integrity. By operating the de-marking device at an appropriate speed and providing the de-marking device with a sharp cutting surface or a fine grit abrasive surface, as the case may be, a reflective surface finish can be obtained suitable to produce a visibly distinct mark when re-marking with a laser.

In an illustrated embodiment, ICs are automatically conveyed into and out of engagement with the de-marking device. The carrying device may comprise a belt having pockets or recesses formed therein to receive at least one IC so that ICs placed in the pockets can be passed under the de-marking device, de-marked, cleaned, dried and conveyed to receiving magazines to be transported for further processing, such as testing and re-marking. Likewise, the carrying device may comprise a translatable table or platen capable of retaining a plurality of ICs in position for processing. In any case, the de-marking device may be translatable relative to the carrying device, or stationary with the ICs passing under the de-marking device moved by the carrying device. Moreover, the de-marking device may be movable in a Z-axis direction relative to the carrying device or the carrying device may be movable in a Z-axis direction relative to the de-marking device for the de-marking device to engage the marked surface of the IC to a desired depth.

A singulating feed mechanism may also be incorporated into the de-marking apparatus in some embodiments. Accordingly, the ICs may be fed individually, or singulated, onto a track from magazines holding a plurality of marked ICs. As a magazine empties, an automatic shuttle mechanism that removes an empty magazine and replaces it with a full one to continue the feed operation may be incorporated into the apparatus. ICs may then substantially continuously proceed down the track to a staging mechanism that positions the ICs at substantially precise locations along the track. Such a staging mechanism may include a series of pins, each for stopping a single IC in a selected position. A transferring mechanism can then pick up the ICs located at the staging mechanism and transfer them to the carrying or transport device. Such a transferring mechanism may comprise a plurality of vacuum pick-up heads that are translatable between the staging mechanism and the carrying or transport device.

The de-marking apparatus may also comprise a de-marked IC receiving mechanism including another transferring mechanism, which picks up de-marked ICs from the carrying device and places them on a track. The de-marked ICs can then proceed down the track into an empty magazine. As a magazine becomes full, another automatic shuttle mechanism may be employed to replace the full magazine with an empty one.

Because of the speed of the de-marking device and the frictional heat generated thereby, it may be desirable to cool the IC during the mark removal process by supplying a flow of water onto the area of contact between the de-marking device and the surface of the IC. The water flow also minimizes the release of abrasive and packaging particulates into the surrounding atmosphere and reduces the tendency of the de-marking device to load up with material removed from the IC packages. In addition, because the removal process will generate some debris which remain on the surfaces of the ICs, it may be desirable to wash the ICs after de-marking. Accordingly, a water wash utilizing spray nozzles may be employed. Moreover, a drying system through which the ICs pass may be employed to dry the ICs after the water wash. The carrying device moving the ICs through the de-marking device may also move the ICs through the washing and drying operations.

As illustrated in FIG. 1, a laser mark removal system 10 comprises a singulating feed device 12 that feeds individual packaged integrated circuits (ICs) contained in stacked, tubular magazines 13 (shown in broken lines) to a staging device 16. The staging device 16 positions the ICs at discrete, predetermined locations so a transferring device 18 can pick up the ICs. The transferring device 18 transfers the ICs to a carrying device 22, also referred to herein as a retaining mechanism, which conveys the ICs through the system. Specifically, the carrying device 22 moves the ICs under a motor-driven mark removal device 20 comprised of a rotating cutting or abrasive head 15 that removes a small, precise amount (depth) of material from an exposed surface of each IC, thus removing any engraved laser mark therefrom. As shown, the head 15, driven by motor 11, includes drive pulley 17, contact wheel 19, and idler pulley 21 and abrasive belt 23. It is noted that the carrying device 22 may comprise any conventional system for moving ICs relative to the mark removal device 20, such as a belt, link or chain conveyor, an indexing table or platen, and the like. The mark removal device 20 will later be described in more detail with respect to FIG. 5.

Because some debris is generated by the mark removal system 10, the carrying device 22 moves the ICs from the mark removal device 20 to a washing and rinsing system 24 and a drying system 26 to clean and dry the de-marked ICs. The carrying device 22 then moves the de-marked ICs to another transferring device 28 that transfers the ICs to an IC receiving device 30. The receiving device 30 automatically stores the de-marked ICs in empty magazines 13 (not shown in receiving device 30 for clarity). In order to fully automate the system 10, conventional automatic shuttle mechanisms (shown in FIG. 1 in the depiction of the singulating feed device 12 and the IC receiving device 30) replace empty magazines with full ones at the singulating feed device 12 and full magazines with empty ones at the IC receiving device 30. In addition, a control system 9, such as a suitably-programmed personal computer with conventional accessories, is utilized to automatically control the operation, timing and sequence of various devices of the system 10 to de-mark the ICs responsive to sensor input.

Figure 2:
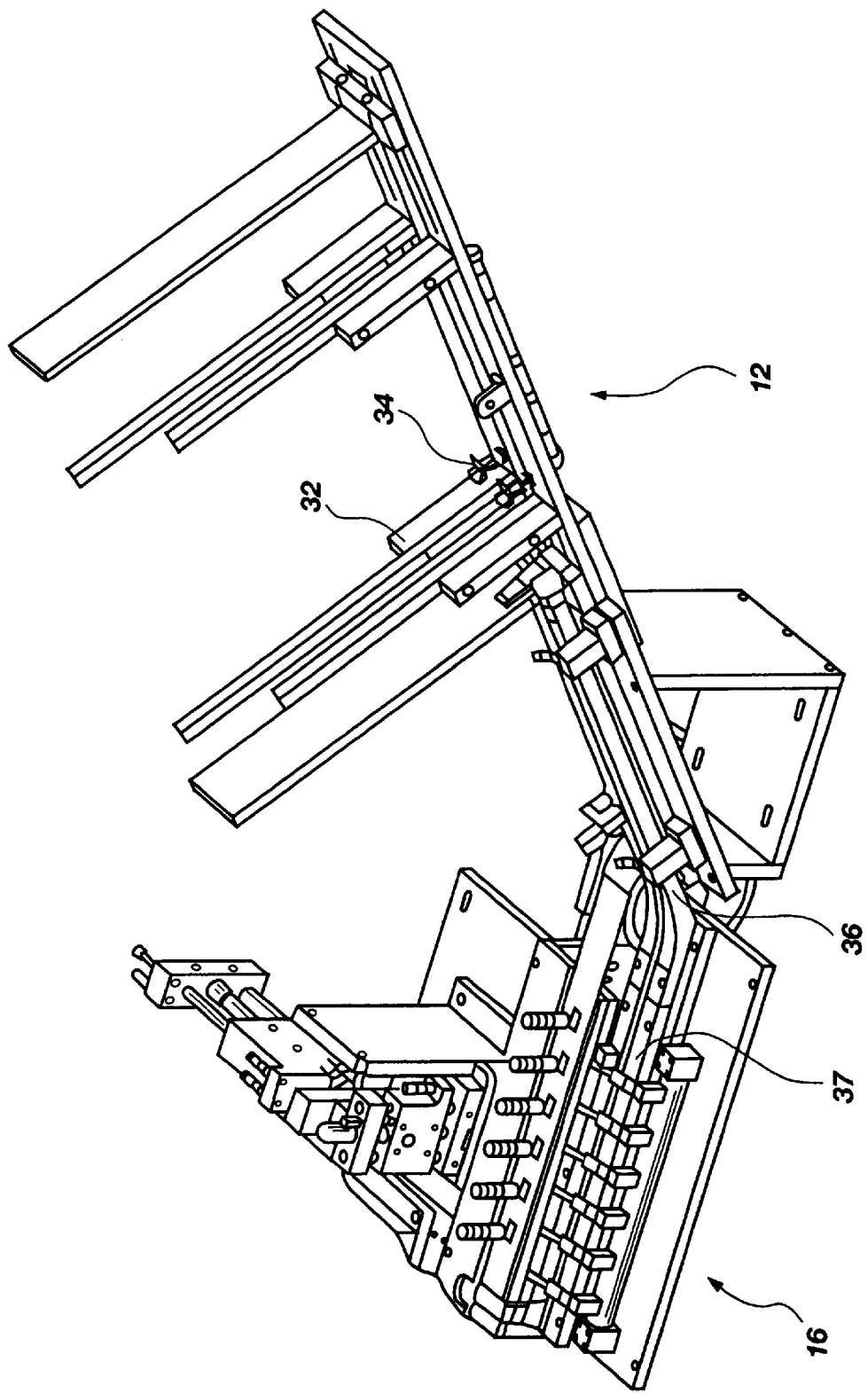
FIG. 2 is an isometric view of a singulating feed device illustrated in FIG. 1.

As illustrated in FIG. 2, one embodiment of the singulating feed device 12 comprises an IC magazine holder 32, an automatic feed mechanism 34 for holding a stack of tubular magazines containing ICs and selectively releasing ICs from a lowermost tubular magazine, and a feed track 36 positioned at an angle relative to the horizontal that receives the ICs from a magazine and feeds the ICs to the staging device 16.

Figure 3:
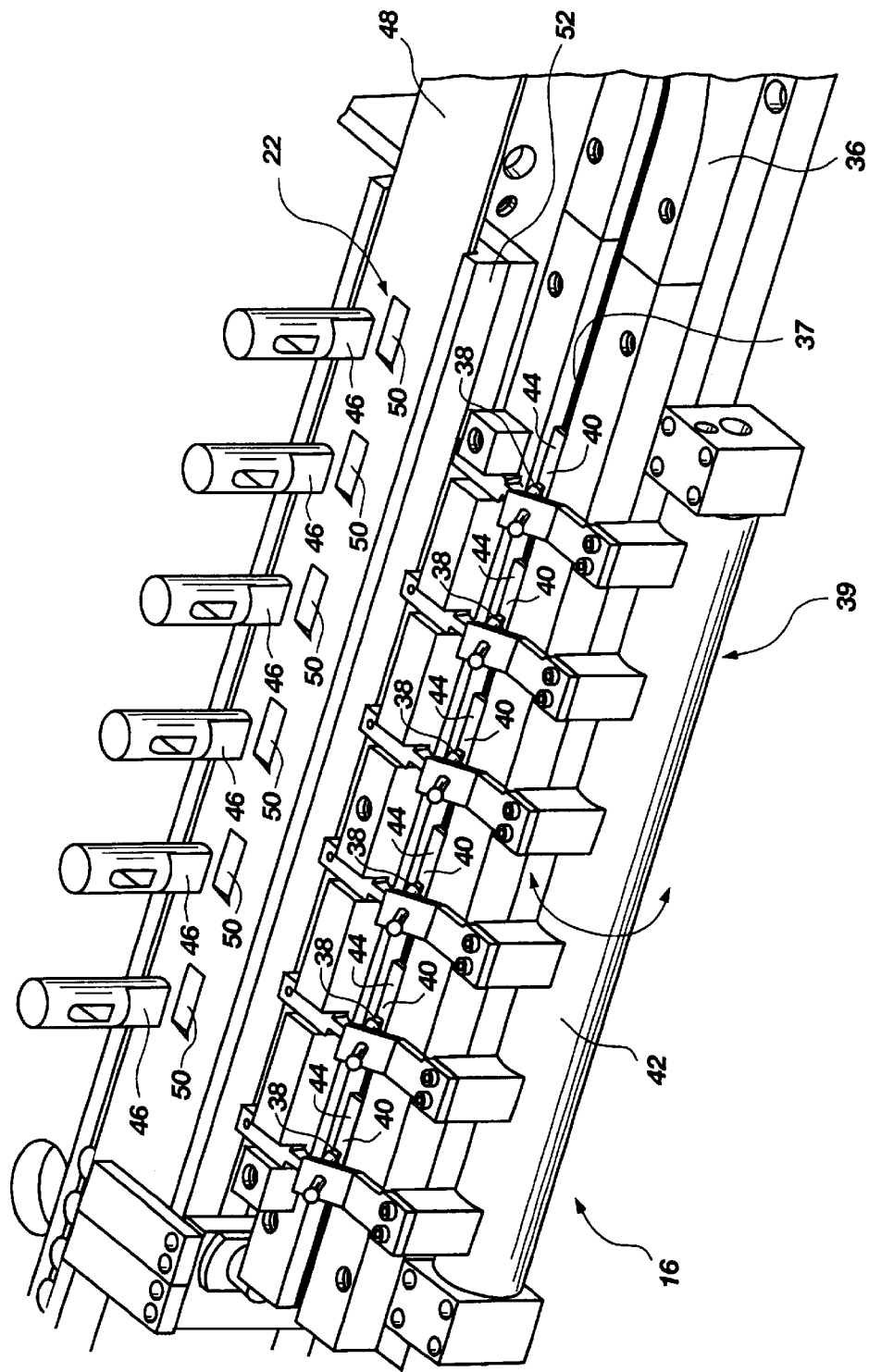
FIG. 3 is a close-up, isometric view of input staging, transferring, and carrying or transport devices also illustrated in FIG. 1.

Referring now to FIG. 3, the IC staging device 16 may include fiber-type optical sensors 38 which sense the presence of an IC 40 in each receiving location of staging device 16. Similar sensors 38 may detect passage of ICs from the tubular magazines onto and from feed track 36 to staging track 37, to prevent overfeeding of ICs and to detect when a feed is not effected. Sensors 38 may optionally comprise any other conventional proximity sensor as known in the art. Staging device 16 may also include IC retaining members that each selectively engage and retain an IC 40 received in staging track 37 from feed track 36, which also employs such retaining members for IC feed control. Specifically, as ICs 40 slide down the track 36, the sensors 38 detect the presence of an IC and cause an associated stop member "upstream" of that sensor (referencing the direction of IC movement) to activate in sequence so that the next-in-sequence IC 40 coming down track 36 will stop in the detection field of the next upstream sensor 38. The stop members may comprise pins, rods, cams, lever arms or other conventional structures selectively insertable into and removable from the path of the ICs entering feed track 36 or staging track 37 of staging device 16. In one embodiment, stop members (not shown) comprise solenoid-driven indexing pins extendable upwardly from the side or bottom of staging track 37. Pneumatic, hydraulic or electrical cylinders may also be used to drive and control the stop members, as known in the art. When each stop member on staging track 37 has one IC 40 on its upstream side as confirmed by a sensor 38, the group of spaced ICs 40 (in one embodiment, six (6) ICs) is ready for picking by vacuum heads 46. It should be noted that access to staging track 37 is easily provided by swivel mounting assembly 39, which carries all sensors 38 disposed over staging track 37. Swivel mounting assembly 39 is rotatably retractable about an axis parallel to staging track 37, and lockable in position over staging track 37 for operation.

To avoid damage to the ICs 40, the vacuum heads 46 of staging device 16 may each be preferably individually spring-loaded to make compliant contact with an IC 40 and also tipped with an elastomer tip. Vacuum heads 46 are spaced from one another by a distance substantially equal to the distance between the ICs 40 positioned by the retaining members of staging device 16. As shown in FIGS. 1 and 3, the outer housing for the vacuum heads 46 has been omitted for clarity. An outer housing is shown for comparison purposes in FIGS. 1 and 4 for a similar transferring device 28. The transferring device 18 moves the group of vacuum heads 46 transverse to the direction of staging track 37 from their rest position over carrying device 22 to a location over the ICs 40 in their staging positions. Transferring device 18 then lowers the vacuum heads 46 so each vacuum head 46 engages the top surface 44 of an IC 40. A selectively actuated or valved vacuum is drawn through the vacuum heads 46 to cause the vacuum heads 46 to each pick up an IC 40. The vacuum heads 46 are then raised vertically and moved transversely back over the carrying or transport device 22. The heads 46 are then lowered to the carrying device 22 and the vacuum is released, causing the ICs 40 to be deposited on the carrying or transport device 22. Each vacuum head 46 includes an associated vacuum sensor to detect the pick-up and retention of an IC 40 from staging track 37 and to signal the operator if an IC has not been picked up or has been dropped during transfer to carrying or transport device 22.

Figure 5:
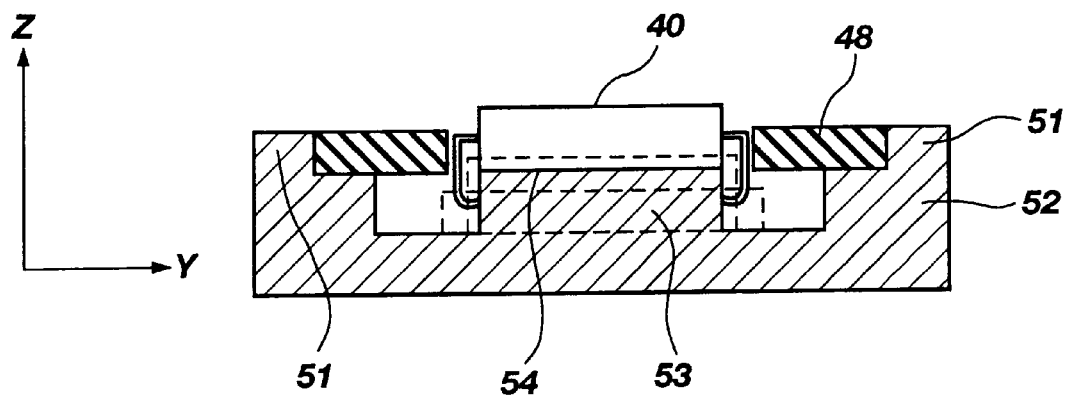
FIG. 5 is a cross-sectional end view of the transport device illustrated in FIG. 1.

Referring to FIGS. 3 and 5, the carrying device 22 may comprise any device that can transport the ICs 40 from station to station in system 10, such as an elastomeric belt 48, having a plurality of rectangular pockets, openings or recesses 50 therethrough spaced substantially the same distance as the vacuum heads 46. The openings 50 may be sized and shaped to each hold one IC 40, although the openings need not be precisely sized to receive a particularly-dimensioned IC, as will be further explained. An elongated transport track 52 lies under and to the sides of the belt 48 to provide a rigid support beneath the ICs 40 in the openings 50. In one embodiment, there is a uniform 1.5 inch spacing between the fronts of adjacent pockets or openings 50 in belt 48, such spacing corresponding to the relative intervals between ICs 40 on staging track 37 and the spacing of vacuum heads 46. A belt 48 with pockets or openings 50 of different width may be substituted as necessary. Further, the center section 53 of elongated track 52 may be removable and replaceable as shown in broken lines with other center sections 53 of differing height and widths. This feature accommodates (in some instances in conjunction with belt replacement) ICs of different width and depth. The replaceable center sections 53 may be precision-milled, at least on the track section under de-marking or mark removal device 20, to ensure a solid, even, flat support for ICs 40 to control exposure to the de-marking belt 23 and limit the depth of material removed to, for example, 0.001 inch.

Figure 5A:
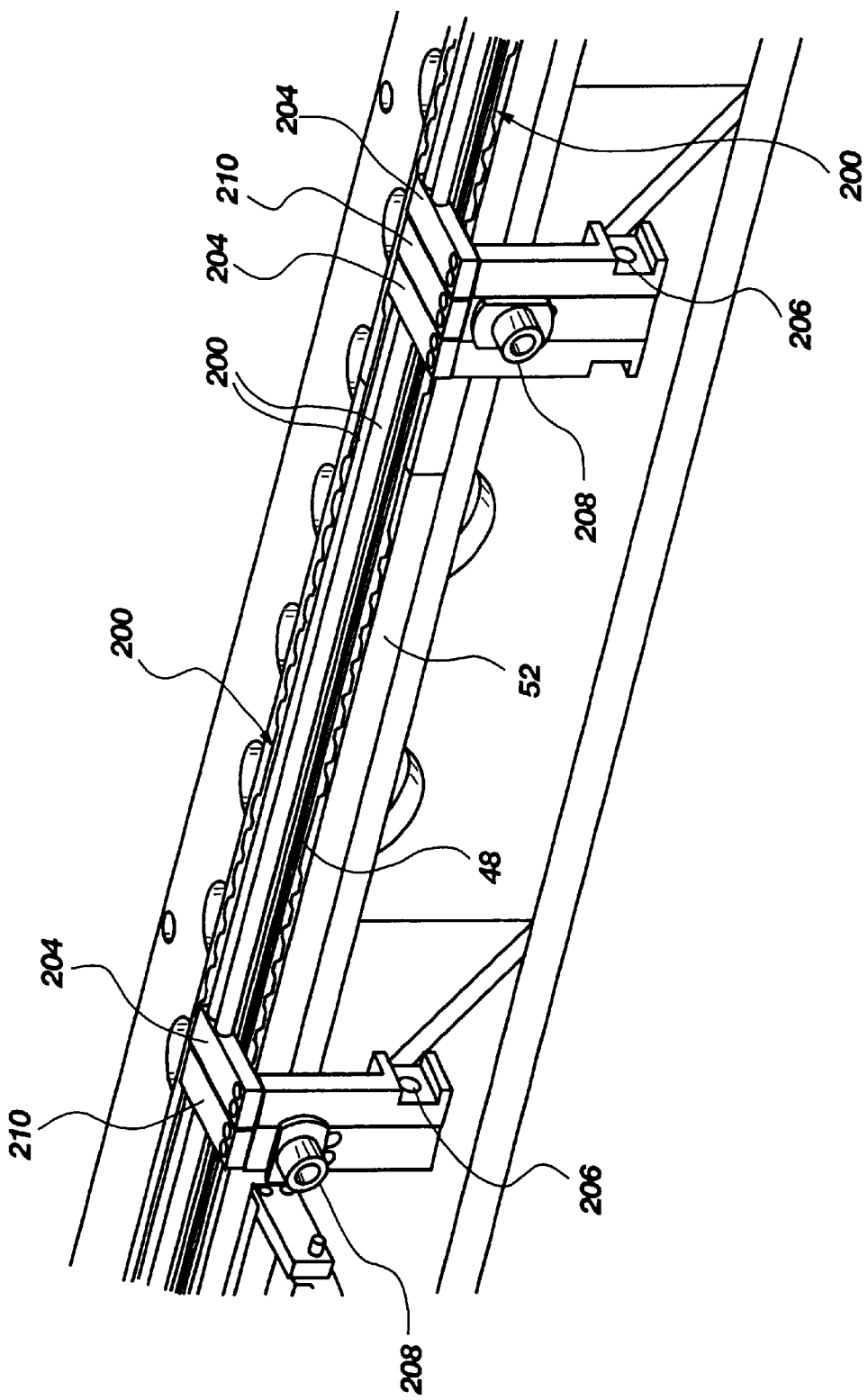
FIGS. 5A and 5B are enlarged perspective views of retention rail assemblies usable with carrying devices employed with the invention.
Figure 5B:
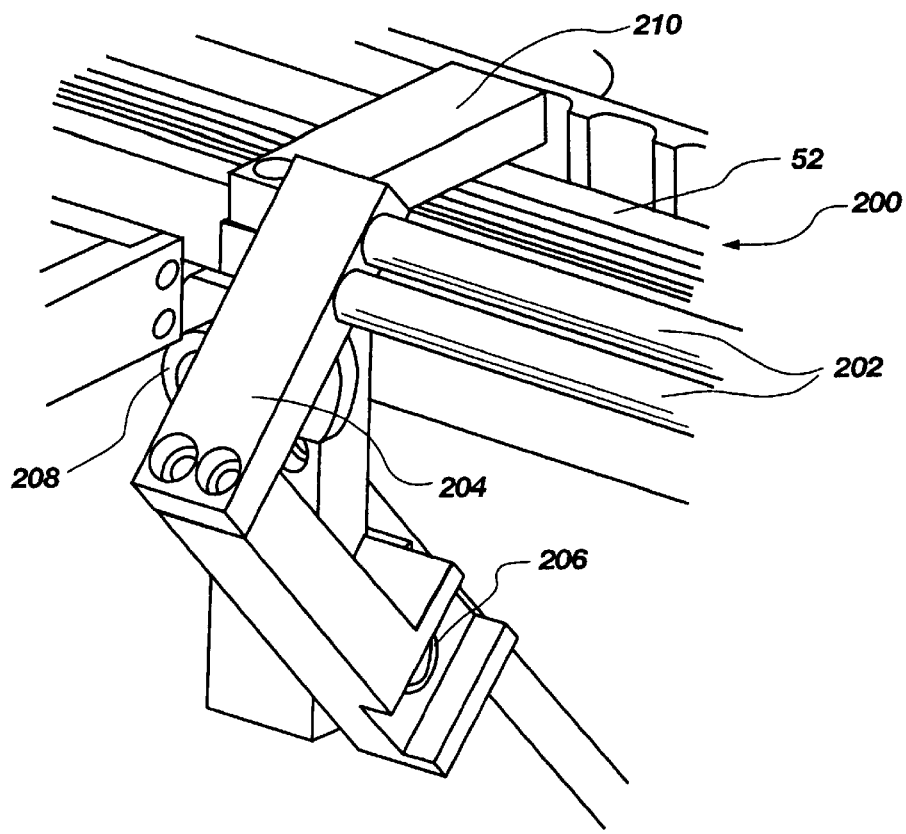

It is also contemplated that IC containment structures comprising retention rail assemblies 200 may be employed with system 10. Referring to FIGS. 5A and 5B, retention rail assemblies 200 may be located over belt 48 to retain ICs 40 carried in pockets 50 of belt 48. Such retention rail assemblies 200 may also be useful proximate mark removal device 20 (see FIG. 1), when contact of mark removal device with an IC 40 may otherwise tend to cause belt 48 to flex.

Similarly, retention rail assemblies 200 may be located in the vicinity of washing and rinsing system 24 and drying system 26 to retain ICs 40 in pockets 50 under the effects of contact by pressurized water and air. Retention rail assemblies 200 may be pivotally mounted to swing away from the top of track 52, and lockable over track 52 for operation. Retention rail assemblies 200 may comprise dual, mutually parallel rods 202 secured at each end to a frame 204 hinged at 206 to pivot toward (and over) or away from track 52. A dual rod system allows containment of parts (ICs 40) while permitting good access by water and air from, respectively, washing and rinsing system 24 and drying system 26 to the surfaces of the parts. Rotatable stops 208 mounted to supports 210 may be employed to lock retention rail assemblies 200 over track 52 and belt 48, and consequently over ICs 40 carried by belt 48.

Figure 4:
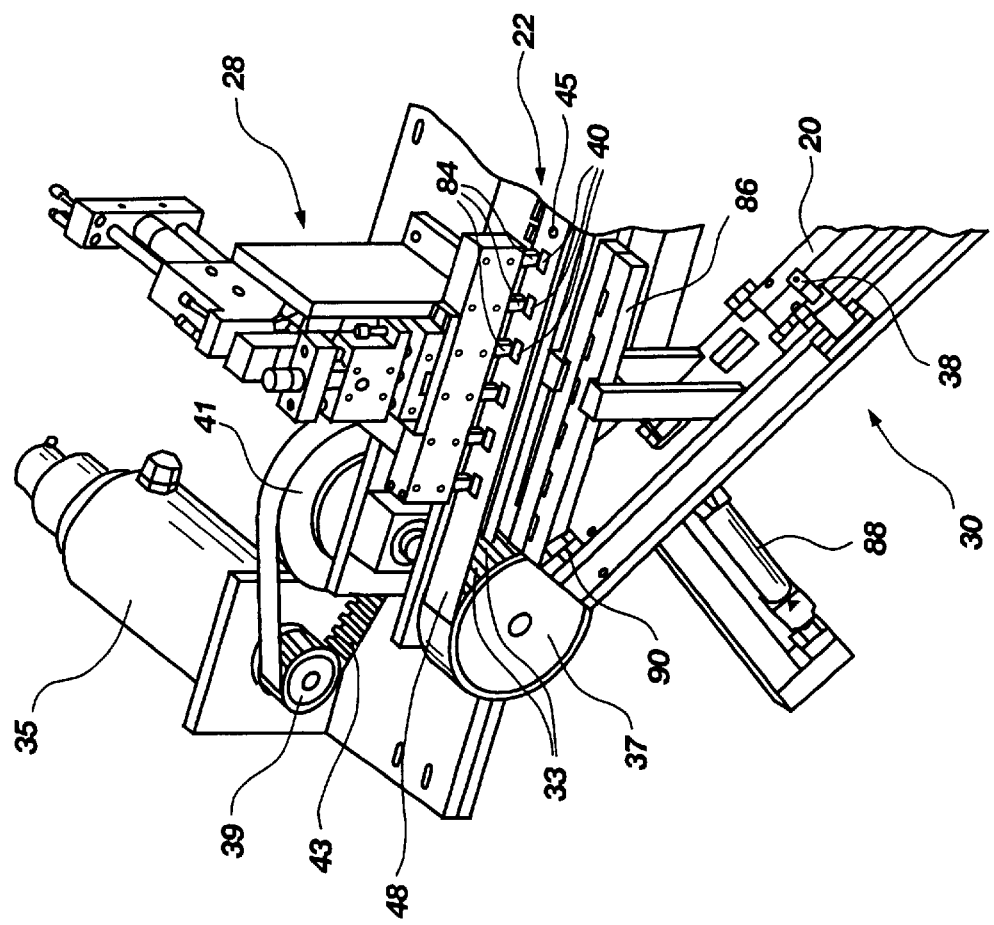
FIG. 4 is a close-up, isometric view of an output transferring device illustrated in FIG. 1.

Referring now to FIG. 4, the carrying device 22 may be motor-driven and may include a stepper motor 35 that can move the belt 48 of carrying device 22 to discrete locations, as for loading and unloading ICs 40. The stepper motor 35 can regulate speeds, as for moving the ICs 40 under the mark removal device 20 during the de-marking operation. Speed of movement of ICs 40 under mark removal device 20 may be varied to achieve different surface finishes, a relatively slower speed resulting in more polishing of the IC surface during material removal. Also, to keep the belt 48 of the carrying device 22 from slipping about slave pulley 37, pulley 37 and belt 48 may be cogged with the cogs 33 preferably spaced approximately 0.5 inches apart. Likewise, the drive and driven pulleys 39 and 41, respectively, and drive belt 43 may be cogged to reduce or eliminate the possibility of slippage. Also, to ensure that the belt 48 and the ICs 40 have been positioned in the proper place, the belt 48 may include periodically-spaced indexing apertures 45 through which a light may shine from below and be optically detected to confirm successful motion of belt 48 for loading of the next successive group of ICs 40. Likewise, sensors above belt 48 might be used to sense whether a light has been blocked by an IC 40 and signal the control system 9 that the ICs 40 are in the correct position. Such sensors could also be positioned at various other locations in and around the system 10 to detect the position of various components of the system 10. In one embodiment, indexing apertures are separated on belt 48 by eight (8) intervening pockets or openings 50. In the disclosed embodiment, six (6) ICs 40 are disposed in each group of eight (8) pockets 50, with a vacant pocket 50 at each end of the group. This arrangement is employed to ensure two IC-free spaces or pockets in belt 48 under the head 15 (see later description) of the mark removal device 20 during loading and unloading of groups of ICs 40 as described herein.

At the outlet end of carrying device 22, the ICs 40 are conveyed to another vacuum pick-up transferring device 28 similar to device 18. The transferring device 28 picks up each group of six (6) ICs 40 from the carrying device 22 by vacuum heads 84. Heads 84, which are individually spring-loaded and elastomer tipped and employed with associated vacuum sensors as previously disclosed with respect to heads 46, move the ICs 40 as a group over the receiving device 30, and deposit the ICs 40 in a horizontally-positioned, pivotable receiving track 86. Once the ICs 40 are deposited, the receiving track 86 is pivoted by cylinder 88 about pin 90 to an inclined position. Sensors such as magnetic switches, contact switches or proximity sensors may be employed to detect the up and down position of receiving track 86 to prevent improper feed from transferring device 28. Cylinder 88 may be controlled to regulate acceleration and deceleration of track 86 so as not to cause ICs 40 to jar loose or jam on the track. The ICs 40 are retained in the track 86 until it is inclined to a position aligned with a magazine loading device 92. The ICs 40 are then released by depression of a spring-loaded element contacting the surface of the track landing supporting holding track 91 (although retention members of the type previously described might alternatively be employed) so that ICs 40 slide out of the track 86 and over holding track 91 to an aligned, empty tubular magazine 13 carried by magazine loading device 92. Sensors, preferably optical sensors 38 as previously described, detect the ICs 40 passing a given point, so that ICs 40 can be counted and individually singulated and IC flow onto holding track 91 and then into a lowermost tubular magazine carried by device 92 may be controlled. The magazine feed of device 92 works similarly to that previously described with respect to feed device 12, except in this instance a stack of empty tubular magazines 13 is filled one by one with ICs. Each full magazine 13 at the bottom of the stack is then ejected into bin 93 and replaced with another empty one aligned with holding track 91.

The apparent reverse orientation of the receiving track 86 provides several benefits which may not be readily apparent. First, the orientation of receiving track 86 significantly shortens the length of system 10 of the invention. Second, and more significant, is that ICs 40 are removed from system 10 and deposited in tubular magazines in the same orientation as they are loaded. Thus, pin 1 of each IC 40 is oriented toward the open end of each magazine 13 when being fed to system 10, and likewise pin 1 of each IC 40 is oriented to the open magazine end after unloading therefrom. Thus, the orientation of ICs 40 is maintained, and the ICs 40 may be re-fed directly from the "exit" magazines without further manipulation for other operations such as testing and re-marking.

As shown in the cross-sectional end view of the track 52 in FIG. 5, the outer protrusions 51 of track 52 retain the belt 48 laterally, so the belt 48 will maintain its transverse or Y-axis position relative to the track 52. Center section 53 supports the bottom surface 54 of the IC 40 so the bottom surface 54 is supported in the Z-axis direction.

Figure 6:
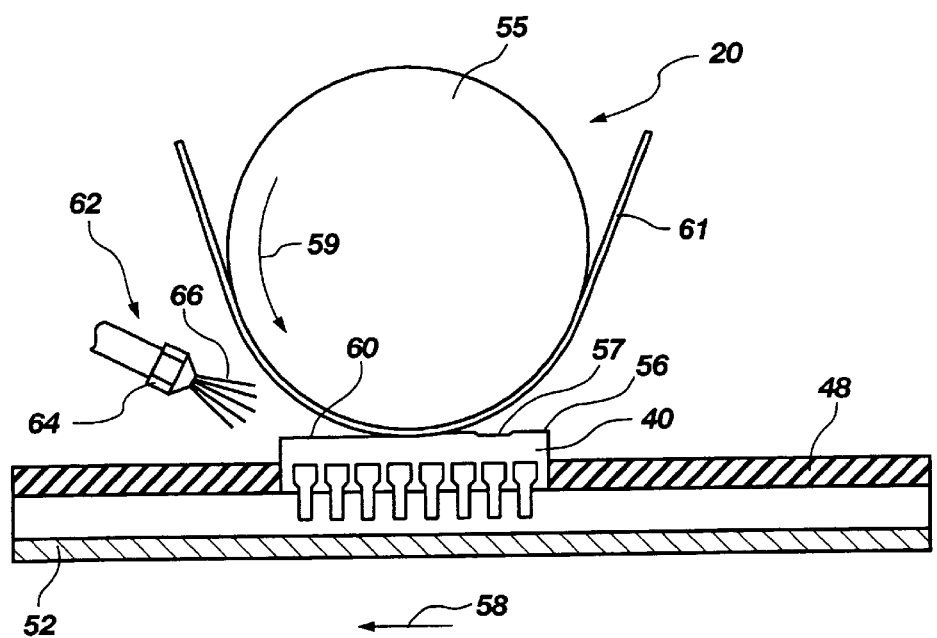
FIG. 6 is a cross-sectional schematic side view of the mark removal device illustrated in FIG. 1.

In FIG. 6, a cross-sectional side view of the track 52, an exemplary IC 40 is fed under the mark removal device 20 so a substantially even layer of material from the top surface 56 of the IC 40 is removed. In one embodiment, the removal device 20 removes enough material to exceed the depth of a laser mark 57 (typically about 0.001 inches of packaging material). Also in one embodiment, when IC 40 is moved in the direction of arrow 58, the mark removal device 20 is rotated in the direction of the arrow 59 so the IC 40, during contact, moves in the opposite relative direction to the direction of rotation of the mark removal device 20.

The de-marking head 55 may comprise a bladed mill, a sanding disk, a sanding head or similar device. In one embodiment, de-marking head 55 comprises a contact wheel 19 (see FIG. 1) about which is driven an abrasive belt 61 (which may correspond to belt 23 of FIG. 1), such as a diamond-impregnated, epoxy-filled, finger-spliced, woven-fiber belt available from 3M® as a FLEX BELT™. Such belts may carry metal-bonded, synthetic diamond particles or grit in the size range of 6 to 40 microns, or other superabrasive particles such as cubic boron nitride. For this application, grit in the size range of 6 to 20 microns is believed to be suitable for removal of plastic package material. A larger grit will remove package material more rapidly (for a given belt speed), while a smaller grit provides more opportunity for controlled mark removal and may provide a more polished, reflective surface for re-marking. Grit size may also be varied to accommodate different package material. The mark removal device 20 itself, which carries and drives belt 61, may comprise a VIRTU-BRADE™ Precision Tool Post Grinder, sold by Dynabrade company of Clarence, N.Y. The contact wheel 19 may be of metal, or a rubber exhibiting appropriate durometer characteristics, for precise dimensional control of the package depth removed. Suitability of a 70 durometer rubber wheel has been demonstrated. The use of a finger-spliced, epoxy-filled belt 61 as previously referenced also provides precise dimensional control by affording a "seamless" or endless belt effect so that the belt splice does not protrude beyond or recede beneath the rest of the belt surface.

As shown in FIG. 1, the mark removal device 20 may be mounted so as to be movable vertically (Z-direction) and laterally horizontally (Y-direction) on a carriage 20a, the movement of which may be controlled precisely, such as by precision manual screw drives 20b and 20c, such drives having graduated dials and locks. In a preferred embodiment, both Y- and Z-direction movement is controlled responsive to rotation or revolution of incrementally-rotatable, shallow-pitch control shafts of the screw drives, wherein one complete revolution may, by way of example, advance or retract the carriage 20a approximately 0.060 inch. Thus, dimensional accuracies of 0.001 inch are achievable. It is also useful to note that the Y-direction of movement provides more extensive use of the surface of belt 23, which may be up to five to six or more times as wide as the packaged ICs 40. For example, an IC 40 may have a width (transverse to the direction of movement of belt 48) of about 0.3 inch, while belt 23 may have a width of about 2.0 inches, or in excess of six times the width of ICs 40. Thus, when an area of belt 23 becomes loaded with package material or is excessively worn, belt 23 may be stepped sideways several times to present new surfaces for removing package material. As a result, system downtime is reduced, for only when belt 23 becomes loaded with IC package material substantially across its entire width or worn substantially across its entire width must the system operation be stopped for belt cleaning or (if worn) replacement.

Referring again to FIG. 6, it should be again noted that at least a somewhat reflective surface 60 is useful so that when such ICs 40 are re-marked using a laser beam, the new mark contrasts and is easily visible. In order to achieve a surface 60 having a desired surface reflectivity, it may be necessary to rotate the contact wheel 19 at relatively high speed (e.g., as much as 4500 SFPM belt surface speed). The resulting frictional heat can generate temperatures that could damage the internal circuitry of the IC 40 and greatly decrease belt life. Accordingly, a fluid dispensing system 62 may be provided to enhance heat transfer from the IC 40 and the mark removal device 20 at the area of mutual contact during operation, cooling abrasive belt 61 and elastomeric carrier belt 48 and suppressing dust from the mark removal process. Such a fluid dispensing system 62 may comprise a nozzle 64 that can direct a spray of water 66 to the desired location to control and remove the heat generated by the mark removal process. By removing particulate matter (primarily package material) generated during the abrasive mark removal operation, the water spray assists in achieving the desired reflective surface 60 on each IC 40. The water spray also keeps such particulates in suspension so they are not released in the air and cleans the abrasive belt 61 and reduces its tendency to load up with adhered material removed from the IC packages, thus prolonging belt life. The water 66 may be filtered and recycled to be continuously reused by the fluid dispensing 62. Further, the water 66 may initially be heated to better remove debris and clean belt 61.

A remote belt wash head may optionally be used to rinse belt segments not actively engaged, to clean the previously-employed belt segments of debris before the carriage again laterally traverses to place the now-cleaned segment of the belt back in service. Such a remote belt wash head may also be employed to help maintain a desirably low abrasive belt temperature and suppress dust away from the contact area with ICs 40.

As previously noted, other package material removal devices may be employed in lieu of the aforementioned VIRTUBRADE™ tool post grinder. Desirable features of the material removal device include the use of superabrasive materials of small size (for long wear and consistency) and a relatively unyielding, precision-controlled contact head to produce only the desired depth of package material removal.

Figure 7:
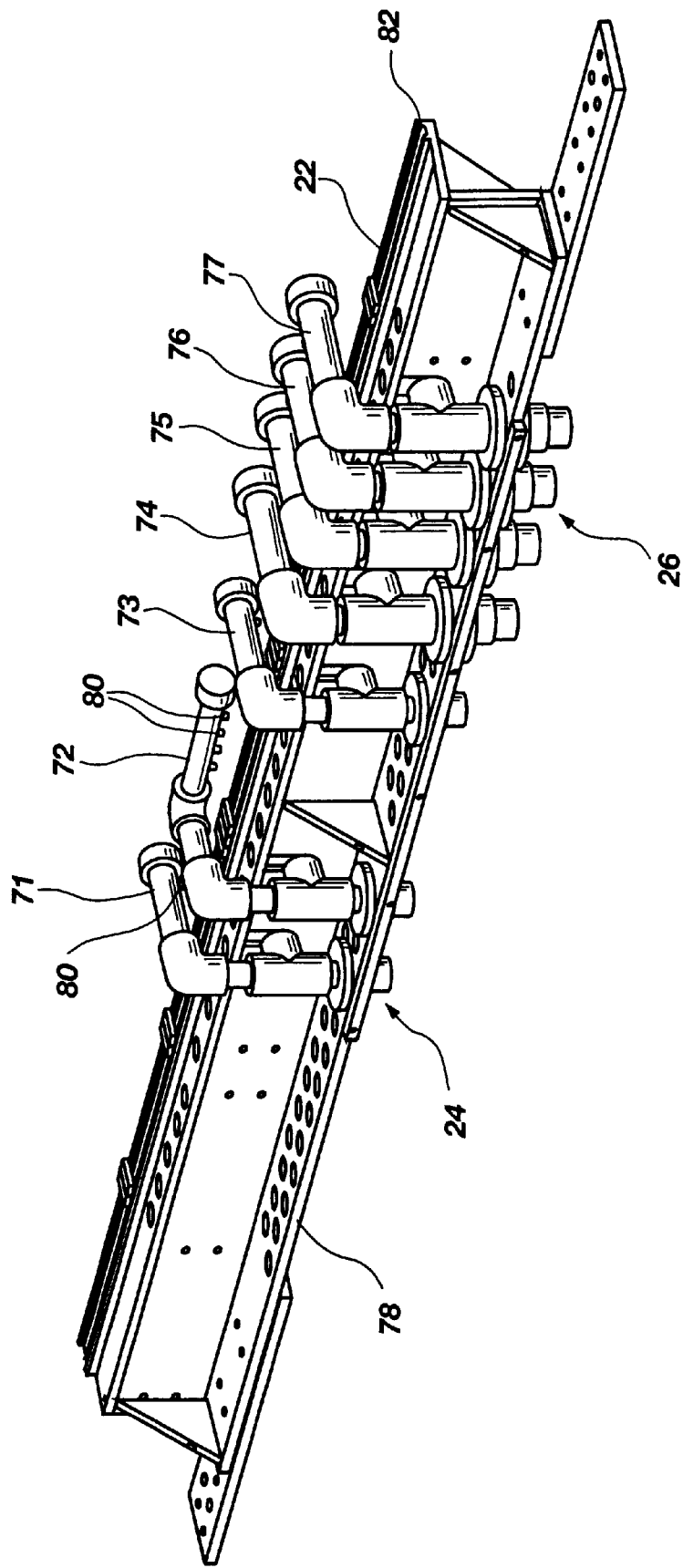
FIG. 7 is an isometric view of cleaning and drying devices illustrated in FIG. 1 from the reverse side of the system.

Because some debris will be generated during the mark removal process, as shown in FIG. 7, a washing and rinsing system 24 and subsequent drying system 26 may be provided following the de-marking operation. Washing heads 71, 72, and 73 and drying heads 74, 75, 76, and 77 (the washing and drying heads comprising discharge nozzles) are attached to a frame member 78 and extend over belt 48 of the carrying or transport device 22. The washing heads 71, 72, and 73 each have one or more discharge nozzles 80 that are supplied with a suitable cleaning fluid, such as water, to wash and rinse away debris generated during the mark removal operation. The water may be preheated to better clean the ICs 40 and belt 48. The water may also be circulated with a high pressure pump, for example at 120 psi, to further enhance the cleaning of the ICs 40 and belt 48. The water for washing heads 71, 72 and 73 may be supplied from the same recycled water supply used in the spray nozzle 64 (shown in FIG. 5) or a combination of recycled and fresh water may be used for heads 71 and 72, while fresh, hot water is preferably used to supply final rinse fluid for head 73. As illustrated, counterparts of washing heads 71, 72, and 73 (partially shown in FIG. 7 entering frame member 78) also extend beneath the carrying device 22 to wash the bottoms of ICs 40 that have been de-marked and clean the belt 48 of debris. Track 52 may have apertures through the bottom thereof in this area and in the drying area to facilitate fluid flow to the bottom of ICs 40. Likewise, drying heads 74, 75, 76, and 77 are supplied with a suitable high-volume source of gas, such as ambient air, that may be preheated to dry the ICs 40. The drying heads 74, 75, 76, and 77 may also include counterpart heads extending below the ICs 40 to dry both the top and bottom of the ICs 40 as the ICs 40 move through drying system 26, and to dry the cleaned belt 48. A more complete view of the lower washing and drying heads is afforded by FIG. 1. It should be noted that the air may be heated to a certain extent when compressed in a blower compressor for delivery through heads 74–77. Thus, allowing for repetitive compression cycles, losses to the surrounding environment and addition of fresh make-up air during cycling of the air flow through system 10, the air temperature in the vicinity of heads 74–77 and thus of belt 48 reaches a steady state temperature of approximately 20° F. to 30° F. above ambient, enhancing drying of the ICs 40. A forced-air drying chamber that surrounds the carrying or transport device 22 may also be utilized to dry the ICs 40. Radiant heat sources might also be employed, and track 52 of carrying device 22 itself could be heated to assist drying of the ICs 40. Appropriately-directed, high pressure compressed air may also be used for drying or dispersing water from the ICs, the belt and the track. In order to accommodate cleaning and drying the bottom of the ICs 40, track 5 on which the ICs 40 ride may have a slotted or otherwise open bottom at the location of the washing heads 71, 72, and 73 and drying heads 74, 75, 76, and 77 to allow water to drain and to afford substantial exposure of the bottom of the ICs 40 to the washing and drying systems 24 and 26.

If desired, to reduce sliding friction and speed movement of the ICs 40 over the various tracks of the system, an air suspension system may be employed to provide an air cushion through the track bottoms at, for example, 1–2 psi. Such a cushion, causing the ICs 40 to "float" on the track, may also lessen the opportunity for ICs 40 jamming on a track by reducing part bounce at the retention members, helping to minimize loading exchanges at the input. The air cushion may also ensure release of ICs 40 to the vacuum heads of the transferring devices 18 and 28. In addition, an air cushion may facilitate removal of moisture from under the ICs 40 after washing.

In the embodiment of FIG. 1, the disclosed system exhibits a workpiece (IC) throughput of 1000 to 2000 or more plastic-packaged ICs per hour using a 40 micron diamond grit at a belt surface speed of 4500 feet per minute. A finer grit, on the order of 20 microns, may provide a lesser throughput but a better, more reflective finish. It will be apparent to those skilled in the art that a different grit size and/or belt speed, as well as depth of cut, might be desirable to remove marks from a ceramic package surface.

In operation, laser mark removal system 10 is controlled by control system 9 under its programming, in association with sensor input from sensors 38 and feedback from subcomponents of the system, such as, by way of example, vacuum head sensors, positional information regarding mark removal device 20 and belt 48, as well as feed and output magazines and their handling mechanisms. Temperature sensors may be included at various locations to monitor IC temperatures and to preclude inadvertent damage. Throughput may also be monitored by control system 9.

It should also be noted that some embodiments of the invention do not operate at a continuous speed, but rather in "batches" or groups of ICs. For example, in system 10, six (6) ICs 40 may be fed to staging track 37 to form a group, which is then transferred to belt 48. Belt 48 then moves the IC group to a position upstream of mark removal device 20. The group of ICs is then moved in series and as a group under the contact wheel 19 (or other contact head, depending on the device employed) where the ICs are contacted by belt 23. Typically, only near-instantaneous contact with each IC is necessary due to the use of superabrasives and a high belt speed. Movement past mark removal device 20 will place the de-marked IC group in washing and rinsing system 24, then in drying system 26, and finally at transferring device 28, where the IC group is moved to receiving track 86 for disposition into output magazines.

It will be appreciated that the de-marking system of FIG. 1 may be utilized to de-mark any packaged integrated circuit device. In some embodiments, the IC devices herein described could be batch-transported as a large batch rather than carried in series from one operation to the next. For example, ICs could be de-marked as a large batch carried on a tray and then carried as a batch to washing and drying operations.

Figure 8:
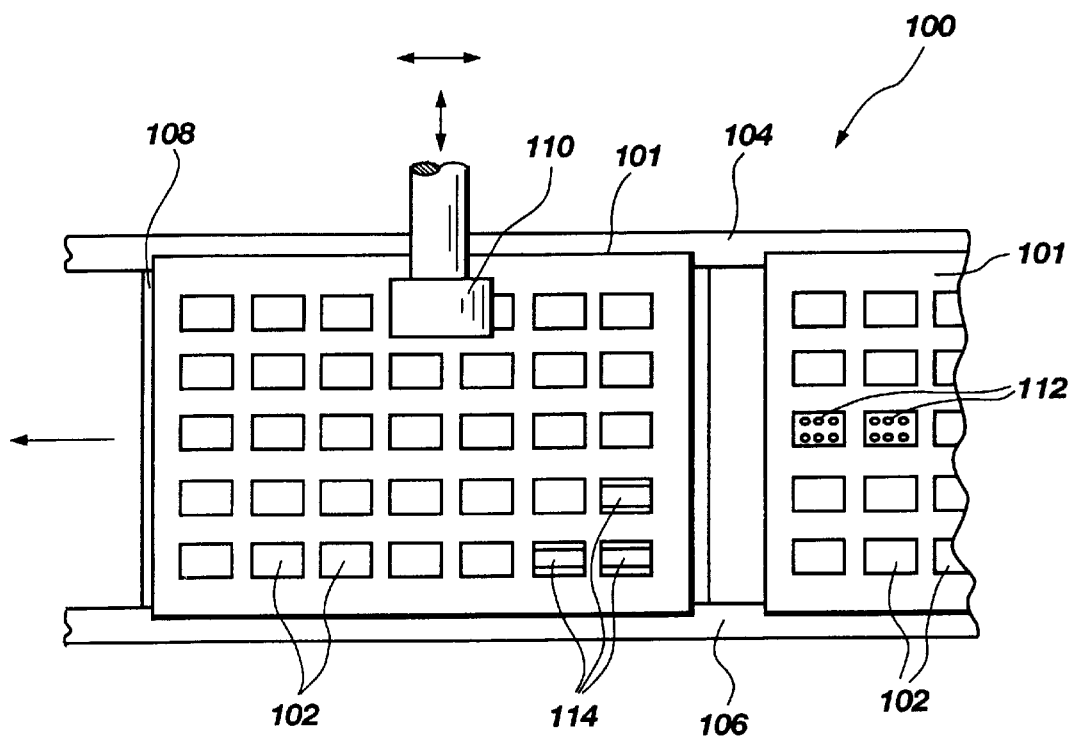
FIG. 8 is a top view of another embodiment of a system for removing laser marks from packaged semiconductor devices.

FIG. 8 schematically depicts a second embodiment 100 of a de-marking system. In lieu of using magazines to load a continuous belt with ICs for de-marking, a series of trays, tables or carriers 101 may be employed to carry ICs and to hold them under a de-marking device 20. Each carrier 101 includes a large plurality of recesses 102, each recess sized to receive one or more ICs. The trays 101 may ride on rails 104 and 106 over a milled metal platen 108, where they are contacted one row at a time by an abrasive mark removal head 110. Head 110 may be at least translatable in the vertical and lateral directions, and may also be translatable in the direction of travel of the carriers 101. A carrier 101 may be clamped downwardly on platen 108 for precise depth control and head 110 moved longitudinally over one or more rows of ICs in recesses 102, returned, moved laterally, and then moved longitudinally again, etc. until an entire carrier of ICs has been de-marked. After de-marking of all the ICs in carrier 101, carrier 101 may then be moved to a washing station and then a drying station. Recesses 102 may include perforated or slotted bottoms or sides 112 to assist drainage and drying air flow, and raised or thicker outer sections 114 to support the package bodies under contact with head 110.

Those skilled in the art will also appreciate that various combinations and modifications of the preferred embodiments may be made without departing from the spirit of the invention and the scope of the accompanying claims.

What is claimed is:

1. An apparatus for de-marking a marked integrated circuit (IC), comprising:
    an IC retaining mechanism including a supported belt structure having a plurality of substantially linearly-aligned IC retainers, each IC retainer configured to hold at least one IC therein; and
    a de-marking head positioned proximate the IC retaining mechanism, the IC retaining mechanism and the de-marking head being placeable for engagement of the de-marking head with a surface of an IC held by the IC retaining mechanism.

2. The apparatus of claim 1, wherein said supported belt structure includes a movable belt and a supporting track, said IC retainers comprise recesses in the belt sized and shaped to receive an IC, and the supporting track is positioned adjacent the movable belt to support and IC positioned in each of the plurality of recesses.

3. The apparatus of claim 2, wherein said IC retaining mechanism further includes an IC containment structure disposable over the movable belt above the plurality of recesses.

4. The apparatus of claim 1, wherein the supported belt structure is translatable relative to the de-marking head.

5. The apparatus of claim 1, wherein the de-marking head is translatable relative to the supported belt structure.

6. The apparatus of claim 1, wherein the supported belt structure is movable toward and away from the de-marking head.

7. The apparatus of claim 1, wherein the de-marking head is movable toward and away from the supported belt structure.

8. The apparatus of claim 1, wherein the de-marking head is selectively placeable proximate said IC retaining mechanism for engagement with a surface of a packaged IC held by the IC retaining mechanism to remove approximately 0.001 inch depth of package material from the surface.

9. The apparatus of claim 1, wherein the de-marking head includes an abrasive belt mounted to at least one contact wheel.

10. The apparatus of claim 9, wherein the abrasive belt comprises superabrasive particles secured thereto.

11. The apparatus of claim 1, further including an IC staging mechanism and a first IC transferring mechanism to transfer at least one IC from the IC staging mechanism to the IC retaining mechanism.

12. The apparatus of claim 11, wherein the first IC transferring mechanism includes at least one vacuum pick-up head for effecting said transfer.

13. The apparatus of claim 11, further including an output mechanism and a second IC transferring mechanism to transfer at least one IC from the IC retaining mechanism to the output mechanism.

14. The apparatus of claim 13, wherein the second IC transferring mechanism includes at least one vacuum pick-up head for effecting said transfer.

15. The apparatus of claim 13, wherein the output mechanism is adapted to hold at least one magazine to receive de-marked ICs.

16. The apparatus of claim 11, further including an IC feed mechanism configured to support at least one magazine containing a plurality of ICs, a feed track extending from the IC feed mechanism to the IC staging mechanism, and a feed control for limiting the number of ICs released from the at least one magazine of the IC feed mechanism.

17. The apparatus of claim 16, further including a shuttle mechanism adapted to hold a plurality of magazines and to position a full magazine for release of ICs to said feed track when another magazine has been emptied of ICs.

18. The apparatus of claim 1, further including an IC cleaning station to substantially clean a de-marked surface of at least one IC.

19. The apparatus of claim 18, wherein the IC cleaning station includes a plurality of spray nozzles for spraying a liquid on said de-marked surface of said at least one IC.

20. The apparatus of claim 19, wherein the IC cleaning station includes an IC drying area.

21. The apparatus of claim 1, further including a liquid dispensing device adjacent the de-marking head.

22. The apparatus of claim 21, wherein the liquid dispensing device includes a spray nozzle for supplying water to a location between said de-marking head and said IC retaining mechanism.

23. The apparatus of claim 22, further comprising a recycling system for water used by the fluid dispensing device.

24. A system for de-marking at least one marked integrated circuit (IC), comprising:
a mark removal device;
an IC feed device for feeding the at least one IC;
an IC carrying device for retaining and positively conveying the at least one IC along a substantially linear path past the mark removal device in contact therewith;
an IC transferring device for moving the at least one IC from the IC feed device to the IC carrying device; and
an IC receiving device for receiving the at least one IC from the IC carrying device.

25. The system of claim 24, further including another IC transferring device for transferring at least one IC from the IC carrying device to the IC receiving device.

26. The system of claim 25, wherein the IC receiving device is adapted to carry at least one magazine.

27. The system of claim 24, further comprising an IC cleaning system positioned adjacent the IC carrying device for substantially cleaning at least one IC conveyed by the IC carrying device after the IC is de-marked.

28. The system of claim 27, wherein the de-marking system includes at least one fluid spray nozzle oriented to direct fluid to an area of contact between said mark removal device and a surface of said at least one IC.

29. The system of claim 28, further including an IC cleaning system comprising a rinsing system positioned adjacent the mark removal device.

30. The system of claim 29, wherein the IC cleaning system includes an air drying system adjacent the rinsing system.

31. The system of claim 29, further including a water supply.

32. The system of claim 31, further including a recycling system associated with the water supply.

33. The system of claim 32, further including a high pressure pump for circulating water from the water supply.

34. The system of claim 24, wherein the IC feed device comprises:
a feed track;
a support structure for holding at least one magazine having a plurality of marked ICs therein for feeding the plurality of marked ICs individually from the at least one magazine onto the feed track; and
a staging device positioned adjacent the feed track for receiving the individual ICs from the feed track and for staging the individual ICs at discrete locations for pickup by the IC transferring device.

35. The system of claim 34, wherein the support structure is configured to support a plurality of magazines, and further including an automatic shuttle mechanism for discarding an empty magazine and positioning a full magazine from said plurality of magazines in its place adjacent the feed track.

36. The system of claim 24, wherein the IC transferring device includes at least one vacuum operated pick-up head movable between a IC feed device and the IC carrying device.

37. The system of claim 24, wherein the IC carrying device comprises a movable belt defining at least one pocket therein sized and shaped to receive at least one IC, at least a portion of the movable belt being positioned over a conveying track, the conveying track providing a substantially rigid base for the at least one IC when in contact with the mark removal device.

38. The system of claim 37, wherein the IC carrying device further comprises an IC containment structure disposable over the movable belt.

39. The system of claim 24, wherein the mark removal device comprises a movable abrasive element.

40. The system of claim 39, wherein the mark removal device includes an abrasive belt engaging at least one contact wheel positionable adjacent the IC carrying device to contact a marked surface of the at least one IC.

41. The system of claim 40, wherein the IC carrying device is movable in an opposite direction to rotation of the abrasive belt when an IC carried by the IC carrying device is in contact with the abrasive belt.

42. The system of claim 40, wherein said abrasive belt carries superabrasive particles thereon.

43. The system of claim 39, further including a fluid dispensing system for dispensing fluid between the at least one marked IC and the mark removal device proximate an area of mutual contact.

44. The system of claim 24, wherein the mark removal device is positionable to remove a layer of packaging material of approximately 0.001 inch from a marked surface of at least one packaged IC conveyed by the IC carrying device into contact therewith.

45. The system of claim 24, wherein the IC receiving device comprises:
at least one vacuum pick-up head movable between the IC carrying device and a receiving track; and
a support structure for holding at least one empty magazine positioned to receive de-marked ICs from the receiving track.

46. The system of claim 45, wherein the receiving track is configured and oriented to unload de-marked ICs placed thereon into said at least one empty magazine in reverse order to an order in which marked ICs are conveyed past the mark removal device.

47. The system of claim 45, wherein said support structure is configured to support a plurality of magazines, and further including an automatic shuttle mechanism for discarding a full magazine and positioning an empty magazine from said plurality of magazines to receive de-marked ICs from the receiving track.

48. The system of claim 47, wherein the receiving track is movable from a first position for receiving de-marked ICs from the IC carrying device and a second position for releasing received de-marked ICs to an empty magazine.

49. The system of claim 47, further including at least one sensor between the receiving track and the shuttle mechanism for counting de-marked ICs passing therebetween, and a controller responsive to the at least one sensor for determining when a magazine is full and replacing it with an empty magazine.

50. A system for removing marks from integrated circuit (IC) packages comprising:
   an abrasive device for removing a layer of material from an IC package;
   a packaged IC carrying device adapted to carry at least one packaged IC in a substantially constrained manner along a substantially linear path;
   a positioning mechanism for placing the abrasive device and the at least one packaged IC carried by the IC carrying device in mutual contact to a controlled depth; and
   an actuator coupled to one of the abrasive and carrying devices for moving one of the abrasive and IC carrying devices relative to the other of the abrasive and carrying devices at the controlled depth to remove a layer of material from the at least one packaged IC.

51. An apparatus for de-marking marked integrated circuits (ICs), comprising:
   an IC feed mechanism configured to support at least one magazine containing a plurality of ICs;
   a feed control for limiting the number of ICs released from the at least one magazine of the IC feed mechanism;
   an IC staging mechanism;
   a feed track extending from the feed mechanism to the staging mechanism;
   an IC retaining mechanism;
   a first IC transferring mechanism to transfer at least one IC from the staging mechanism to the IC retaining mechanism; and
   a de-marking head positioned proximate the IC retaining mechanism, the IC retaining mechanism and the de-marking head being placeable for engagement of the de-marking head with a surface of an IC held by the IC retaining mechanism.

52. The apparatus of claim 51, wherein the first IC transferring mechanism includes at least one vacuum pick-up head for effecting said transfer.

53. The apparatus of claim 51, further including an output mechanism and a second IC transferring mechanism to transfer at least one IC from the IC retaining mechanism to the output mechanism.

54. The apparatus of claim 53, wherein the output mechanism is adapted to hold at least one magazine to receive de-marked ICs.

55. The apparatus of claim 53, wherein the second IC transferring mechanism includes at least one vacuum pick-up head for effecting said transfer.

56. The apparatus of claim 51, further including a shuttle mechanism adapted to hold a plurality of magazines and to position a full magazine for release of ICs to said feed track when another magazine has been emptied of ICs.

57. A system for de-marking marked integrated circuits (ICs), comprising:
   a mark removal device;
   an IC feed device, comprising:
      a feed track;
      a support structure for holding at least one magazine having a plurality of marked ICs therein for feeding the plurality of marked ICs individually from the at least one magazine onto the feed track; and
      a staging device positioned adjacent the feed track for receiving the marked ICs from the feed track and for staging the marked ICs at discrete locations;
   an IC carrying device for conveying marked ICs past the mark removal device in contact therewith;
   an IC transferring device for moving the staged, marked ICs from the IC feed device to the IC carrying device; and
   an IC receiving device for receiving ICs from the IC carrying device after contact of the mark removal device therewith.

58. The system of claim 57, further including another IC transferring device for transferring ICs from the carrying device to the IC receiving device.

59. The system of claim 58, wherein the IC receiving device is adapted to carry at least one magazine.

60. The system of claim 57, further comprising an IC cleaning system positioned adjacent the IC carrying device for substantially cleaning ICs conveyed by the carrying device after contact with the mark removal device.

61. The system of claim 57, wherein the de-marking system includes at least one fluid spray nozzle oriented to direct fluid to an area of contact between said mark removal device and a surface of a marked IC.

62. The system of claim 57, further including an IC cleaning system comprising a rinsing system positioned adjacent the mark removal device.

63. The system of claim 62, wherein the IC cleaning system includes an air drying system adjacent the rinsing system.

64. The system of claim 57, wherein said support structure is configured to support a plurality of magazines, and further including an automatic shuttle mechanism for discarding an empty magazine and positioning a full magazine from said plurality in its place adjacent the feed track.

65. The system of claim 57, wherein the IC transferring device includes at least one vacuum operated pick-up head movable between the staging device and the carrying device.

66. A system for de-marking at least one marked integrated circuit (IC), comprising:
   a mark removal device;
   an IC feed device for feeding the at least one IC;
   an IC carrying device for conveying the at least one IC past the mark removal device in contact therewith, the IC carrying device comprising a movable belt defining at least one pocket therein sized and shaped to receive at least one IC, at least a portion of the belt being positioned over a conveying track, the conveying track providing a substantially rigid base for the at least one IC when in contact with the mark removal device;

an IC transferring device for moving the at least one IC from the IC feed device to the IC carrying device; and an IC receiving device for receiving the at least one IC from the IC carrying device.

67. The system of claim 66, wherein the IC carrying device further comprises an IC containment structure disposable over the movable belt.

68. A system for de-marking at least one marked integrated circuit (IC), comprising:

an IC carrying device for conveying the at least one IC past a mark removal device in contact therewith;

a mark removal device including an abrasive belt engaging at least one contact wheel positionable adjacent the IC carrying device to contact a marked surface of the at least one IC;

an IC feed device for feeding the at least one IC;

an IC transferring device for moving the at least one IC from the IC feed device to the IC carrying device; and an IC receiving device for receiving the at least one IC from the IC carrying device.

69. The system of claim 68, wherein the IC carrying device is movable in an opposite direction to a direction of rotation of the abrasive belt when an IC carried by the IC carrying device is in contact with the abrasive belt.

70. The system of claim 68, wherein said abrasive belt carries superabrasive particles thereon.

71. The system of claim 68, further including a fluid dispensing system for dispensing fluid between the at least one marked IC and the mark removal device proximate an area of mutual contact.

72. The system of claim 71, further including a water supply.

73. The system of claim 72, further including a recycling system associated with the water supply.

74. The system of claim 73, further including a high pressure pump for circulating water from the water supply.

75. The system of claim 68, wherein the mark removal device is positionable to remove a layer of packaging material of approximately 0.001 inch from a marked surface of at least one packaged IC conveyed by the carrying device into contact therewith.

76. A system for de-marking at least one marked integrated circuit (IC), comprising:

a mark removal device for de-marking the at least one IC;

an IC feed device for feeding the at least one IC;

an IC carrying device for conveying the at least one IC past the mark removal device in contact therewith;

an IC transferring device for moving the at least one IC from the IC feed device to the IC carrying device; and an IC receiving device for receiving the at least one IC from the IC carrying device, the IC receiving device comprising:

at least one vacuum pick-up head movable between the carrying device and a receiving track; and a support structure for holding at least one empty magazine positioned to receive de-marked ICs from the receiving track.

77. The system of claim 76, wherein the receiving track is configured and oriented to unload de-marked ICs placed thereon into said at least one empty magazine in reverse order to an order in which the ICs are conveyed past the mark removal device.

78. The system of claim 76, wherein the support structure is configured to support a plurality of magazines, and further including an automatic shuttle mechanism for discarding a full magazine and positioning an empty magazine from said plurality to receive de-marked ICs from the receiving track.

79. The system of claim 78, wherein the receiving track is movable from a first position for receiving de-marked ICs from the carrying device and a second position for releasing received de-marked ICs to an empty magazine.

80. The system of claim 78, further including at least one sensor between the receiving track and the shuttle mechanism for counting de-marked ICs passing therebetween, and a controller responsive to the at least one sensor for determining when a magazine is full and replacing it with an empty magazine.

* * * * *

UNITED STATES PATENT AND TRADEMARK OFFICE
CERTIFICATE OF CORRECTION

PATENT NO. : 5,997,388
DATED : December 7, 1999
INVENTOR(S) : Canella et al.

It is certified that error appears in the above-identified patent and that said Letters Patent is hereby corrected as shown below:

Title page,
Item [56], in "Primary Examiner", change "Timonthy" to -- Timothy --.

Drawings,
Fig. 3, delete reference numeral "39" along with lead line;
Fig. 4, renumber "37" to -- 27 --; and
Fig. 7, delete reference numeral "82" along with lead line.

Column 1,
Line 5, "change "08/907962," to -- 08/907,962, --,change "1987," to -- 1997, -- and delete "Attorney Docket No. 3054.US";

Column 2,
Line 20, change "Scotch-Brit™" to -- Scotch-Brite™ --;

Column 5,
Line 66, change "39" -- to -- 42 --;

Column 6,
Line 1, change "39" to -- 42 --;

Column 7,
Line 27, change "37," to -- 27, --;
Line 28, before "pulley" insert -- slave -- and change "37" to -- 27 --;

Column 10,
Line 35, change "FIG.5)" to -- FIG. 6); and

Column 11,
Line 1, change "track 5" to -- track 52 --.

Column 12, claim 2,
Line 39, change "and" to -- an --;
Line 40, delete "plurality of";

Column 13, claim 23,
Line 39, change "fluid" to -- liquid --;

Column 13, claim 27,
Line 59, after "cleaning" insert -- the --;

UNITED STATES PATENT AND TRADEMARK OFFICE
CERTIFICATE OF CORRECTION

PATENT NO.  : 5,997,388
DATED       : December 7, 1999
INVENTOR(S) : Canella et al.

It is certified that error appears in the above-identified patent and that said Letters Patent is hereby corrected as shown below:

Column 13, claim 27,
Line 60, after "the" insert -- at least one marked --;

Column 13, claim 28,
Line 61, delete "wherein the de-marking";
Line 62, change "system includes" to -- further including --;

Column 15, claim 50,
Lines 33 and 35, after "and" insert -- packaged IC --

Column 15, claim 51,
Line 46, after "the" (both occurrences) insert -- IC --;
Line 50, after "from the" insert -- IC --;

Column 16, claim 58,
Line 29, after "the" insert -- IC --;

Column 16, claim 60,
Line 35, after "the" insert -- IC --;

Column 16, claim 61,
Lines 37-38, delete "wherein the de-marking system includes" and insert
-- including -- therefor;

Column 16, claim 65,
Line 54, after "and the" insert -- IC ;

Column 16, claim 66,
Line 62, after "receive" insert -- the --;
Line 63, after "of the" insert -- movable --;

Column 18, claim 75,
Line 1, after "the" insert -- IC --;

Column 18, claim 76,
Line 14, after "the" insert -- IC --; and

UNITED STATES PATENT AND TRADEMARK OFFICE
CERTIFICATE OF CORRECTION

PATENT NO. : 5,997,388
DATED : December 7, 1999
INVENTOR(S) : Canella et al.

It is certified that error appears in the above-identified patent and that said Letters Patent is hereby corrected as shown below:

<u>Column 18, claim 79,</u>
Line 31, after "the" insert -- IC --.

Signed and Sealed this

Nineteenth Day of February, 2002

Attest:

Attesting Officer

JAMES E. ROGAN
*Director of the United States Patent and Trademark Office*